United States Patent

Shen et al.

[11] Patent Number: 6,103,633
[45] Date of Patent: Aug. 15, 2000

[54] METHOD FOR CLEANING METAL PRECIPITATES IN SEMICONDUCTOR PROCESSES

[75] Inventors: Yun-Hung Shen, Taipei; Sheng-Liang Pan, Hsin-Chu, both of Taiwan

[73] Assignee: Taiwan Semiconductor Manufacturing Company, Hsin-Chu, Taiwan

[21] Appl. No.: 08/977,190

[22] Filed: Nov. 24, 1997

[51] Int. Cl.[7] .................................................. H01L 21/00
[52] U.S. Cl. ........................ 438/720; 438/734; 438/742
[58] Field of Search ................................. 438/720, 734, 438/742; 216/2

[56] References Cited

U.S. PATENT DOCUMENTS

| | | | |
|---|---|---|---|
| 4,272,612 | 6/1981 | Oliver | 430/323 |
| 5,200,361 | 4/1993 | Onishi | 437/194 |
| 5,238,872 | 8/1993 | Thalapaneni | 437/190 |
| 5,350,488 | 9/1994 | Webb | 156/643 |
| 5,360,510 | 11/1994 | Kadomura | 156/665 |
| 5,413,669 | 5/1995 | Fujita | 156/643.1 |
| 5,641,382 | 6/1997 | Shih et al. | 438/669 |
| 5,888,859 | 3/1999 | Oku | 438/174 |

*Primary Examiner*—Christopher Henderson
*Attorney, Agent, or Firm*—George O. Saile; Stephen B. Ackerman; Rosemary L.S. Pike

[57] ABSTRACT

A new method of cleaning metal precipitates after the etching of metal lines using a two-step process is described. Semiconductor device structures are provided in and on a semiconductor substrate. The semiconductor device structures are covered with an insulating layer. A barrier metal layer is deposited overlying the insulating layer. A metal layer is deposited overlying the barrier metal layer wherein metal precipitates form at the interface between the barrier metal layer and the metal layer. The metal layer is covered with a layer of photoresist which is exposed to actinic light and developed and patterned to form the desired photoresist mask. The metal layer is etched away where it is not covered by the photoresist mask to form metal lines whereby the metal precipitates are exposed on the surface of the barrier metal layer. The barrier metal layer is anisotropically etched into using a high DC bias of greater than 240 volts and thereafter isotropically etched into underlying the metal precipitates whereby the metal precipitates are stripped away from the surface of the barrier metal layer completing the cleaning of the metal precipitates in the formation of metal lines in the fabrication of an integrated circuit.

20 Claims, 3 Drawing Sheets

1

METHOD FOR CLEANING METAL PRECIPITATES IN SEMICONDUCTOR PROCESSES

BACKGROUND OF THE INVENTION (1) Field of the Invention

The invention relates to a method of etching of metal lines, and more particularly, to a method of cleaning metal precipitates after the etching of metal lines in the manufacture of integrated circuits.

(2) Description of the Prior Art

Aluminum and aluminum alloys are often used to form metal lines in integrated circuit processing. To prevent aluminum spiking, a barrier metal layer comprising titanium, titanium nitride, titanium tungsten, or the like, is deposited underlying the aluminum layer. The aluminum layer is etched away where it is not covered by a photoresist mask to form the desired aluminum lines. A metal precipitate forms during aluminum layer deposition at the interface of the aluminum and barrier metal layers. The precipitate may comprise such materials as Al, Si, Cu, Ti, W, and the like, such as $TiAl_3$, $AlCu_x$, $WAl_5$, silicon nodules, copper nodules, etc. Typically, the metal precipitates are cleaned away using a sputter etch. However, not all of the precipitates can be removed by this method. For example, $TiAl_3$, $WAl_5$, or $AlCu_x$ precipitates cannot be removed by sputtering alone.

U.S. Pat. No. 5,238,872 to Thalapaneni teaches the use of a reduced amount of $Cl_2$ in an overetch to remove residual metal stringers. U.S. Pat. No. 5,413,669 to Fujita teaches etching away an unwanted alloy using an etchant gas. U.S. Pat. No. 5,641,382 to Shih et al discloses the use of an ion beam to remove silicon nodules after aluminum etching. U.S. Pat. No. 5,200,361 to Onishi uses a mixed gas of HF and $N_2$ to remove aluminum deposits in a via hole. U.S. Pat. No. 5,350,488 to Webb discloses a low pressure, low temperature etching to prevent copper residues. U.S. Pat. No. 5,360,510 to Kadomura teaches the use of $BCl_3$, $Cl_2$, and HBr in etching aluminum.

SUMMARY OF THE INVENTION

A principal object of the present invention is to provide an effective and very manufacturable method of cleaning metal precipitates after the etching of metal lines.

Another object of the present invention is to provide a method of cleaning metal precipitates after the etching of metal lines using a two-step process.

In accordance with the objects of this invention a new method of cleaning metal precipitates after the etching of metal lines using a two-step process is achieved. Semiconductor device structures are provided in and on a semiconductor substrate. The semiconductor device structures are covered with an insulating layer. A barrier metal layer is deposited overlying the insulating layer. A metal layer is deposited overlying the barrier metal layer wherein metal precipitates form at the interface between the barrier metal layer and the metal layer. The metal layer is covered with a layer of photoresist which is exposed to actinic light and developed and patterned to form the desired photoresist mask. The metal layer is etched away where it is not covered by the photoresist mask to form metal lines whereby the metal precipitates are exposed on the surface of the barrier metal layer. The barrier metal layer is anisotropically etched into using a high DC bias of greater than 240 volts and thereafter isotropically etched into underlying the metal precipitates whereby the metal precipitates are stripped away from the surface of the barrier metal layer completing the cleaning of the metal precipitates in the formation of metal lines in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
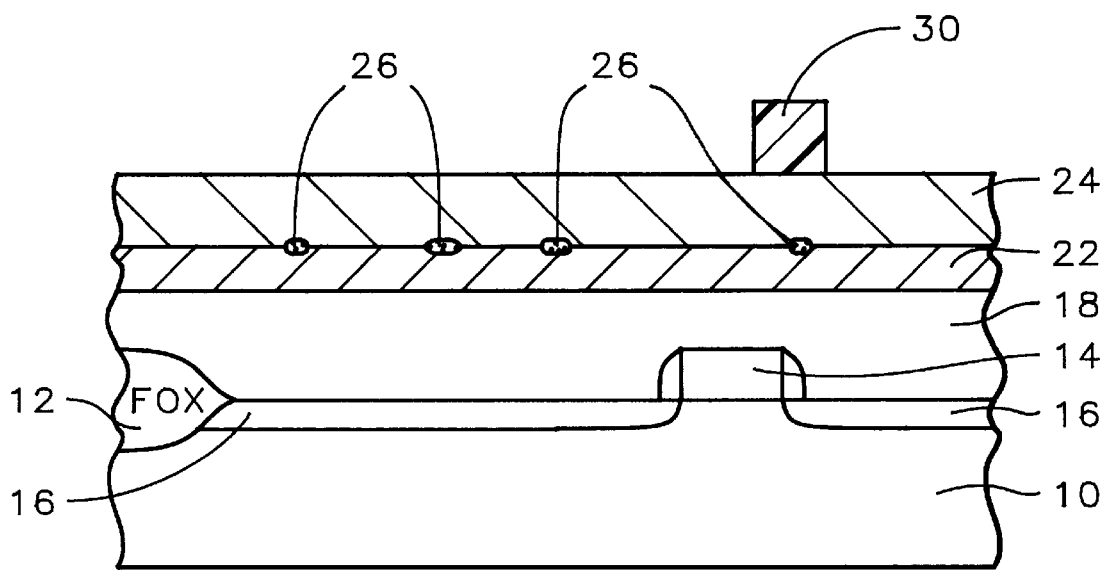
FIGS. 1 through 6 schematically illustrate in cross-sectional representation a preferred embodiment of the present invention.

Referring now more particularly to FIG. 1, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, such as gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures.

Next, a barrier layer 22 is deposited over the insulating layer. This may be titanium nitride or titanium tungsten, or the like, having a thickness of between about 1000 and 1500 Angstroms.

The metal layer 24 is deposited over the barrier layer 22. The metal layer comprises an aluminum alloy such as AlSiCu or AlCu. Typically, the aluminum layer has a thickness of between about 4000 and 9000 Angstroms. Metal precipitates 26 form at the interface between the aluminum layer and the barrier metal layer. Since the alloy contains copper, copper forms beneath the precipitates. The temperature of the aluminum sputtering process is high enough that the atoms diffuse; for example, copper diffuses into the barrier layer and titanium or tungsten diffuses into the aluminum alloy. Also, titanium or tungsten reacts with the aluminum to form other alloys, such as $TiAl_3$, $WAl_5$, or the like.

Figure 2:
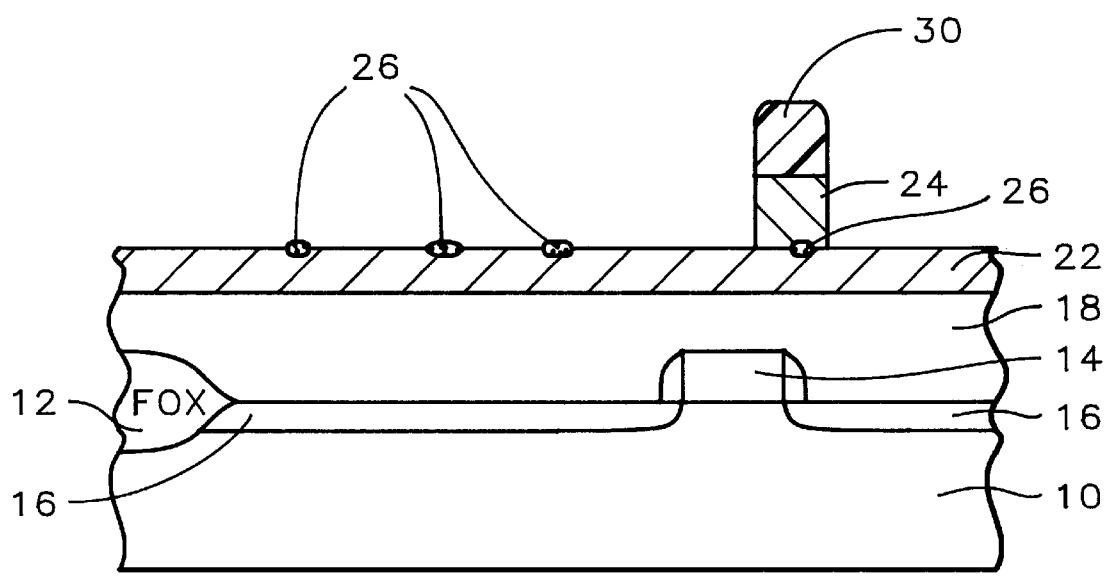

An antireflective coating, not shown, is deposited over the aluminum layer underlying a coating of photoresist. The photoresist is exposed and developed to form the photoresist mask 30. Now, the metal layer is etched away where it is not covered by the mask, as illustrated in FIG. 2.

The conventional aluminum etch uses $CF_4$, $Cl_2$, and $BCl_3$ gases and a negative DC bias of between about 200 and 220 volts. The precipitates 26 remain on the surface of the barrier metal layer after etching. If the precipitates are allowed to remain there, they will act as a mask during etching of the barrier metal layer, causing some of the barrier metal layer to remain. This metal residue will cause problems such as visual defects, poor planarization of subsequent dielectric films, or even shorting of the circuit.

A traditional method of removing the metal precipitates is to use an ion sputterer. However, this method cannot completely remove precipitates such as $TiAl_3$, $WAl_5$, and $AlCu_x$ greater than about 0.1 $\mu$m in size.

Figure 3:
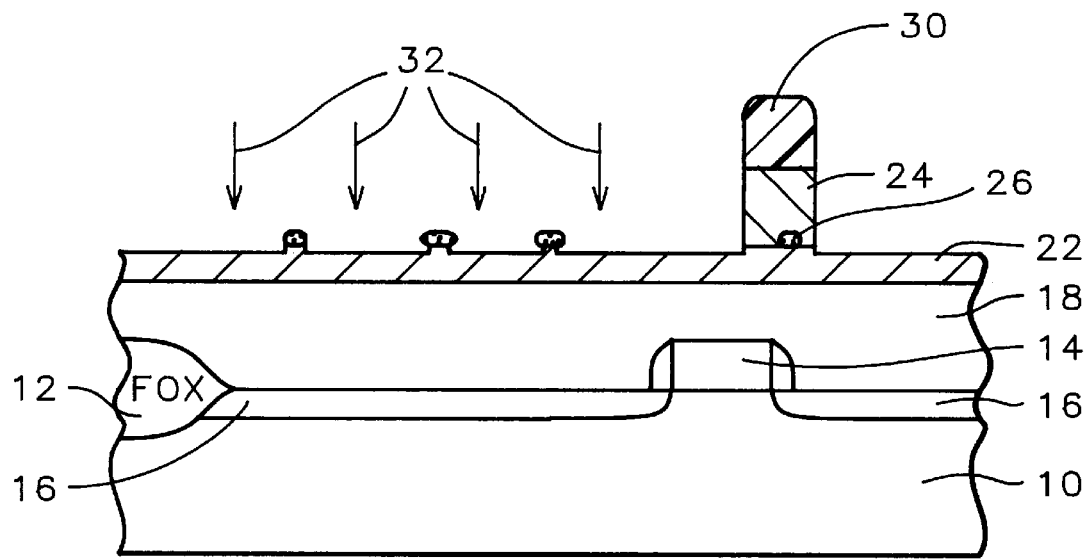

The key two-step cleaning method of the present invention will now be described. The first step is a directional sputter etch using the same ratio of gases as in the aluminum etch; for example, 10–20 sccm of $CF_4$, 150–160 sccm of $BCl_3$, and 30–50 sccm of $Cl_2$. However, a higher DC bias of greater than about 240 volts is used, preferrably 240–250 volts. FIG. 3 illustrates this first etching 32. The higher DC bias is necessary to sputter away precipitates such as silicon nodules or copper nodules which cannot be etched away only by chemical reaction.

The second step of the cleaning process is an isotropic etch. This etch will etch laterally underneath the precipitates 26, thereby stripping off the precipitates.

The second etch step uses the same etchant gases as the first step, but with an increased flow rate for $Cl_2$. For example, a flow rate of 40–60 sccm is used in the second step rather than the 30–50 sccm used in the first step. The DC bias of this etching is lower than in the first etch step, between about 200 to 220 volts. This lower DC bias in combination with a lower $BCl_3:Cl_2$ ratio promotes an isotropic etch.

Figure 4:
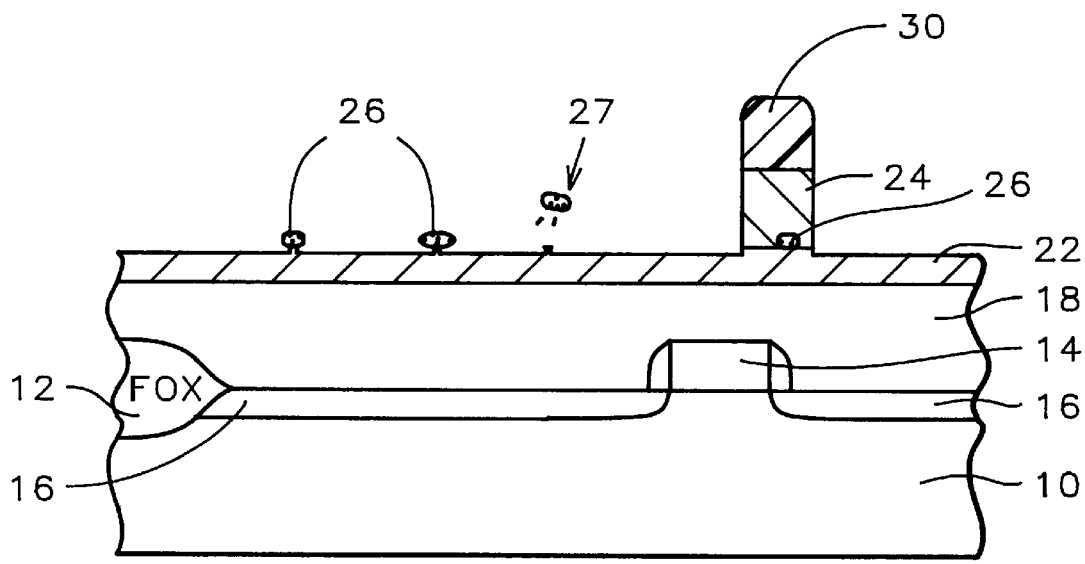
Figure 5:
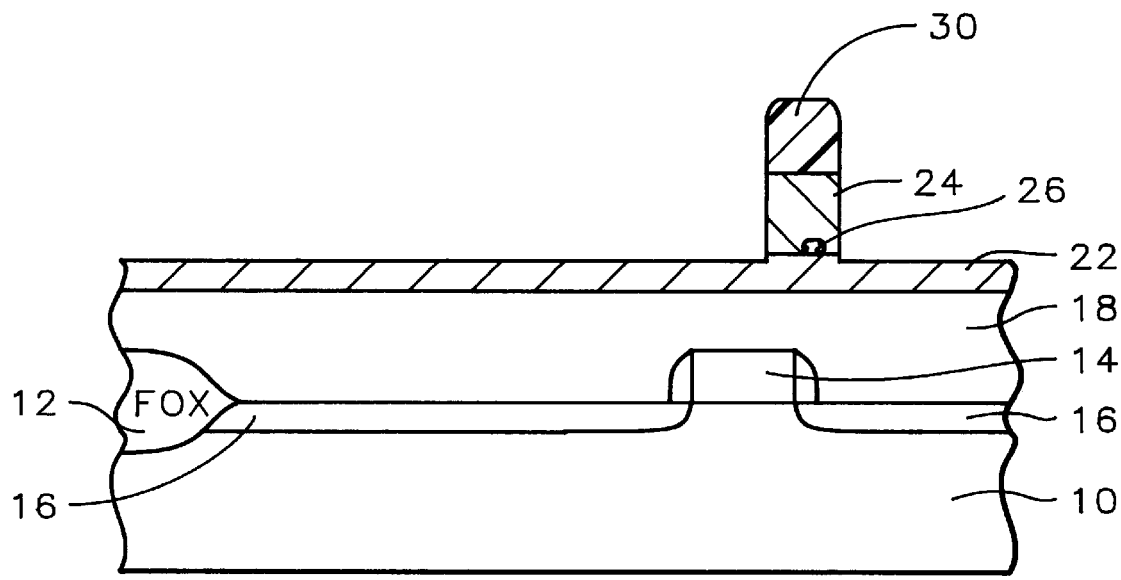

FIG. 4 illustrates the process of the lateral etch of the second step. The barrier metal layer underlying the precipitates is etched away so that the precipitates break off, as illustrated by precipitate 27. Since it is the barrier metal layer that is being laterally etched rather than the precipitates themselves, all types of precipitates can be removed by this method. FIG. 5 illustrates the substrate after all the precipitates have been removed.

Figure 6:
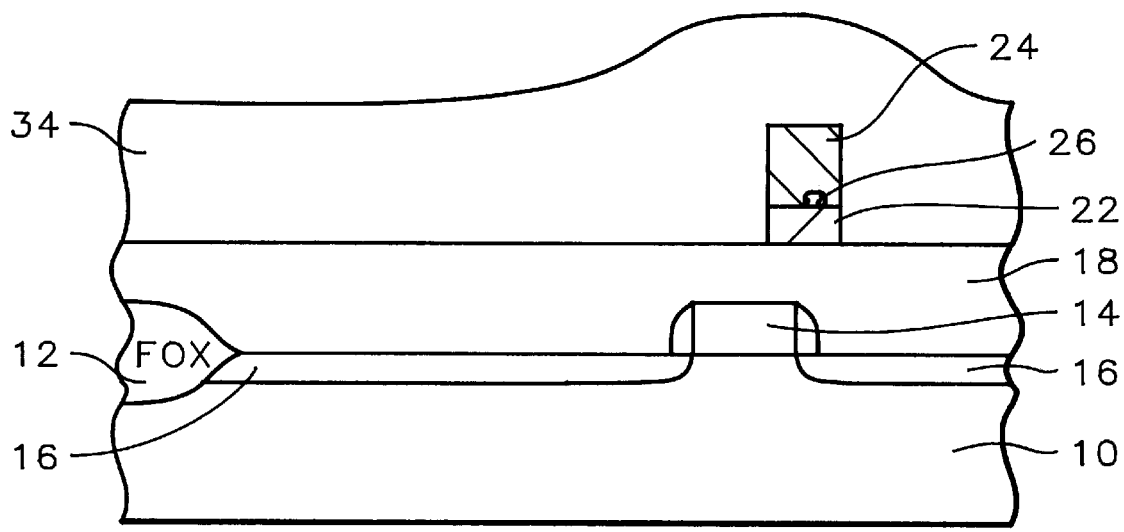

Processing continues as is conventional in the art to etch away the barrier metal layer and cover the metal lines with an intermetal dielectric or passivation layer 34, as illustrated in FIG. 6.

The two-step cleaning process of the present invention combines a sputter etch and an isotropic etch. The process of the invention can remove all types of metal precipitates as large as about 0.3 microns from the interface between the aluminum and the barrier metal layers.

While the invention has been particularly shown and described with reference to the preferred embodiments thereof, it will be understood by those skilled in the art that various changes in form and details may be made without departing from the spirit and scope of the invention.

What is claimed is:

1. A method of cleaning metal precipitates in the formation of metal lines in the fabrication of an integrated circuit comprising:

providing semiconductor device structures in and on a semiconductor substrate;

covering said semiconductor device structures with an insulating layer;

depositing a barrier metal layer overlying said insulating layer;

depositing an aluminum layer overlying said barrier metal layer wherein said aluminum layer is an aluminum alloy containing copper and wherein said metal precipitates form at the interface between said barrier metal layer and said aluminum layer;

covering said aluminum layer with a layer of photoresist;

exposing said photoresist layer to actinic light and developing and patterning said photoresist layer to form the desired photoresist mask;

etching away said aluminum layer where it is not covered by said photoresist mask to form said metal lines whereby said metal precipitates are exposed on the surface of said barrier metal layer;

anisotropically etching into said barrier metal layer using a high DC bias of greater than 240 volts; and thereafter isotropically etching into said barrier metal layer underlying said metal precipitates whereby said metal precipitates are stripped away from said surface of said barrier metal layer completing said cleaning of said metal precipitates in said formation of said metal lines in said fabrication of said integrated circuit.

2. The method according to claim 1 wherein said semiconductor device structures include gate electrodes and source and drain regions.

3. The method according to claim 1 wherein said barrier metal layer comprises titanium nitride having a thickness of between about 1000 and 1500 Angstroms.

4. The method according to claim 1 wherein said barrier metal layer comprises titanium tungsten having a thickness of between about 1000 and 1500 Angstroms.

5. The method according to claim 1 wherein said aluminum layer comprises AlCu having a thickness of between about 4000 and 9000 Angstroms.

6. The method according to claim 1 wherein said aluminum layer comprises AlSiCu having a thickness of between about 4000 and 9000 Angstroms.

7. The method according to claim 1 wherein said metal precipitates comprise nodules of a single material such as silicon or copper and alloys such as $TiAl_3$, $WAl_5$, and $AlCu_x$.

8. The method according to claim 1 wherein said step of etching away said aluminum layer comprises flowing $CF_4$ at 10 to 20 sccm, $BCl_3$ at 150 to 160 sccm and $Cl_2$ at 30 to 50 sccm under a DC bias of 200 to 220 volts.

9. The method according to claim 1 wherein said step of anisotropically etching into said barrier metal layer comprises flowing $CF_4$ at 10 to 20 sccm, $BCl_3$ at 150 to 160 sccm and $Cl_2$ at 30 to 50 sccm under a DC bias of 240 to 250 volts.

10. The method according to claim 1 wherein said isotropically etching into said barrier metal layer comprises flowing $CF_4$ at 10 to 20 sccm, $BCl_3$ at 150 to 160 sccm and $Cl_2$ at 40 to 60 sccm under a DC bias of 200 to 220 volts.

11. A method of cleaning metal precipitates in the formation of metal lines in the fabrication of an integrated circuit comprising:

providing semiconductor device structures in and on a semiconductor substrate;

covering said semiconductor device structures with an insulating layer;

depositing a barrier metal layer overlying said insulating layer;

depositing an aluminum layer overlying said barrier metal layer wherein said aluminum layer is an aluminum alloy containing copper and wherein said metal precipitates form at the interface between said barrier metal layer and said aluminum layer and wherein copper is concentrated underlying said metal precipitates;

covering said aluminum layer with a layer of photoresist;

exposing said photoresist layer to actinic light and developing and patterning said photoresist layer to form the desired photoresist mask;

etching away said aluminum layer where it is not covered by said photoresist mask to form said metal lines whereby said metal precipitates are exposed on the surface of said barrier metal layer;

anisotropically etching into said barrier metal layer using $CF_4/BCl_3/Cl_2$ chemistry having a first ratio of $BCl_3:Cl_2$ and using a high DC bias of greater than 240 volts; and thereafter isotropically etching into said barrier metal layer underlying said metal precipitates using $CF_4/BCl_3/Cl_2$ chemistry having a second ratio of $BCl_3:Cl_2$ lower than said first ratio and using a low DC bias of less than 220 volts whereby said copper concentrated underlying said metal precipitates is etched away thereby stripping away said overlying metal precipitates from said surface of said barrier metal layer completing said cleaning of said metal precipitates in said formation of said metal lines in said fabrication of said integrated circuit.

12. The method according to claim 11 wherein said semiconductor device structures include gate electrodes and source and drain regions.

13. The method according to claim 11 wherein said barrier metal layer comprises titanium nitride having a thickness of between about 1000 and 1500 Angstroms.

14. The method according to claim 11 wherein said barrier metal layer comprises titanium tungsten having a thickness of between about 1000 and 1500 Angstroms.

15. The method according to claim 11 wherein said aluminum layer comprises AlCu having a thickness of between about 4000 and 9000 Angstroms.

16. The method according to claim 11 wherein said aluminum layer comprises AlSiCu having a thickness of between about 4000 and 9000 Angstroms.

17. The method according to claim 11 wherein said metal precipitates comprise nodules of a single material such as silicon or copper and alloys such as $TiAl_3$, $WAl_5$, and $AlCu_x$.

18. The method according to claim 11 wherein said step of etching away said aluminum layer comprises flowing $CF_4$ at 10 to 20 sccm, $BCl_3$ at 150 to 160 sccm and $Cl_2$ at 30 to 50 sccm under a DC bias of 200 to 220 volts.

19. The method according to claim 11 wherein said step of anisotropically etching into said barrier metal layer comprises flowing $CF_4$ at 10 to 20 sccm, $BCl_3$ at 150 to 160 sccm and $Cl_2$ at 30 to 50 sccm under a DC bias of 240 to 250 volts.

20. The method according to claim 11 wherein said isotropically etching into said barrier metal layer comprises flowing $CF_4$ at 10 to 20 sccm, $BCl_3$ at 150 to 160 sccm and $Cl_2$ at 40 to 60 sccm under a DC bias of 200 to 220 volts.

* * * * *